United States Patent
Shin et al.

(10) Patent No.: US 11,837,462 B2
(45) Date of Patent: Dec. 5, 2023

(54) SOLAR SPECTRAL WAVELENGTH CONVERTING MATERIAL AND SOLAR CELL COMPRISING SAME

(71) Applicant: HANWHA TOTAL PETROCHEMICAL CO., LTD., Seosan-si (KR)

(72) Inventors: Hyo Joo Shin, Seosan-si (KR); Young Rae Kim, Seosan-si (KR); Yeon Shick Yoo, Seosan-si (KR)

(73) Assignee: HANWHA TOTAL PETROCHEMICAL CO., LTD., Chungcheongnam-do (KR)

( * ) Notice: Subject to any disclaimer, the term of this patent is extended or adjusted under 35 U.S.C. 154(b) by 110 days.

(21) Appl. No.: 17/208,155

(22) Filed: Mar. 22, 2021

(65) Prior Publication Data

US 2022/0102594 A1  Mar. 31, 2022

(30) Foreign Application Priority Data

Sep. 29, 2020 (KR) .................... 10-2020-0127117

(51) Int. Cl.
| | |
|---|---|
| *H01L 33/50* | (2010.01) |
| *H01L 31/0216* | (2014.01) |
| *H01L 31/048* | (2014.01) |
| *C09K 11/06* | (2006.01) |
| *H01L 33/56* | (2010.01) |

(Continued)

(52) U.S. Cl.
CPC ............ *H01L 33/502* (2013.01); *C09K 11/06* (2013.01); *H01L 31/02168* (2013.01); *H01L 31/0481* (2013.01); *B82Y 20/00* (2013.01); *B82Y 40/00* (2013.01); *C09K 2211/14* (2013.01); *H01L 33/56* (2013.01); *H01L 2933/0041* (2013.01)

(58) Field of Classification Search
CPC ............ H01L 33/502; H01L 31/02168; H01L 31/0481; H01L 33/56; H01L 2933/0041; H01L 31/055; H01L 31/0328; H01L 31/02167; C09K 11/06; C09K 2211/14; C09K 11/08; C09K 11/641; B82Y 20/00; B82Y 40/00; Y02E 10/52; Y02E 10/549
See application file for complete search history.

(56) References Cited

U.S. PATENT DOCUMENTS

| | | | |
|---|---|---|---|
| 2014/0212668 A1 | 7/2014 | Dichtel | |
| 2014/0352784 A1* | 12/2014 | Kim | C09K 11/02 252/301.16 |
| 2020/0317563 A1* | 10/2020 | Sakai | C03C 17/42 |

FOREIGN PATENT DOCUMENTS

| | | | |
|---|---|---|---|
| JP | 5321543 B2 | 10/2013 | |
| JP | 2016044232 A | * 4/2016 | |
| JP | 2017226762 A | * 12/2017 | |

(Continued)

OTHER PUBLICATIONS

MinHye Kim "Synthesis of colloidal aluminum hydroxide nanoparticles for transparent luminescent polymer nanocomposite films" Materials and Design 175 (2019) 10780 (Year: 2019).*

*Primary Examiner* — Michael Y Sun
(74) *Attorney, Agent, or Firm* — TUCKER ELLIS LLP; J. Derek Mason

(57) ABSTRACT

A solar spectral wavelength converting material with improved efficiency and a solar cell including the same. According to an embodiment, a solar spectral wavelength converting material includes an aluminum hydroxide precursor and an aromatic ring compound or a derivative including the same.

12 Claims, 7 Drawing Sheets

(51) Int. Cl.
*B82Y 40/00* (2011.01)
*B82Y 20/00* (2011.01)

(56) References Cited

FOREIGN PATENT DOCUMENTS

| | | | |
|---|---|---|---|
| JP | 6492544 | B2 | 4/2019 |
| KR | 20160060988 | A | 5/2016 |

* cited by examiner

FIG. 1A
FIG. 1B
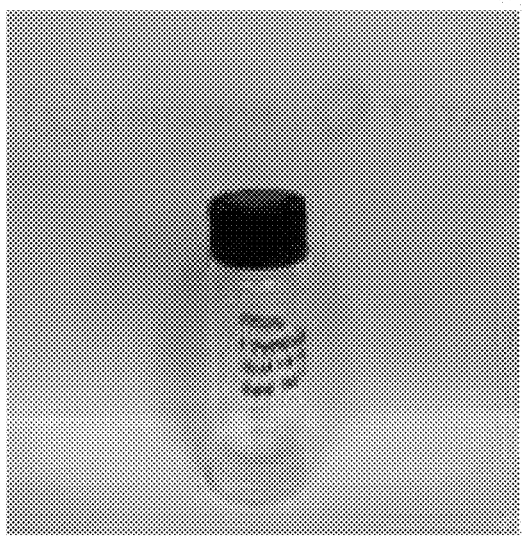
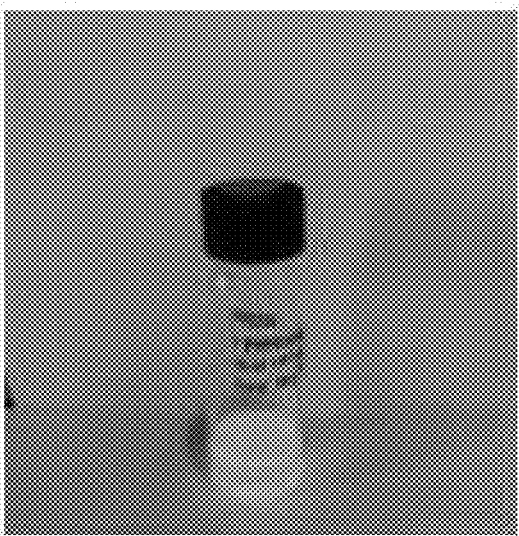

SOLAR SPECTRAL WAVELENGTH CONVERTING MATERIAL AND SOLAR CELL COMPRISING SAME

RELATED APPLICATION DATA

This application claims the benefit of Korean Application No. 10-2020-0127117, filed Sep. 29, 2020, the disclosure of which is incorporated herein by reference in its entirety.

BACKGROUND

1. Field

Embodiments relates to a solar spectral wavelength converting material with improved efficiency and a solar cell including the same.

2. Description of the Related Art

A solar cell which is most commonly commercialized is manufactured with a single silicon material, and does not use about 30% light due to the mismatch between the natural solar spectrum and the band gap of the single silicon material. That is, the natural solar spectrum has a wide distribution (280 to 2500 nm and 0.5 to 4.4 eV) from ultraviolet ray to infrared ray wavelength regions, whereas a silicon solar cell is only capable of absorbing some wavelengths of ultraviolet ray and visible ray wavelength regions.

Recently, a study on using a solar spectral converter has been proposed to solve the limitation and improve the light conversion efficiency of natural sunlight and a silicon solar cell (Chem. Soc. Rev., 2013, 42, 173). That is, introducing a solar spectral converter to a silicon solar cell, wherein the solar spectral converter converts light in an ultraviolet region where the solar absorption of silicon is insufficient or in an infrared region with smaller energy than a silicon band gap into light of a visible ray region which silicon can absorb well.

According to Wang, Fengyou, et al., Boosting spectral response of multi-crystalline Si solar cells with Mn2+ doped CsPbCl3 quantum dots downconverter, when manganese-doped CsPbCl3 is introduced into multi crystalline-Si solar cells, it can secure more sunlight as a downconverter, so that the efficiency may be increased by 6.2% based on an EQE measurement value. This material is a perovskite material, and is characterized by being harmful to a human body since lead is used, and also has a disadvantage of being poor in ultraviolet ray durability and being vulnerable to moisture.

In Fix, T. et al., Enhancement of silicon solar cells by downshifting with Eu and Tb coordination complexes, a CIGS material using a lanthanum-based element as a dopant was introduced into EVA to increase the efficiency of c-Si cells by 8% (EQE measurement). In this paper, the efficiency of a mono cell was increased by 8%, but an expensive converter such as CIGS was used, so that there is a disadvantage in that it is still difficult to commercialize as material used for the c-Si cells.

SUMMARY

An aspect of the present invention provides a low-cost aromatic ring-based solar spectral wavelength converting material capable of improving the photocurrent conversion efficiency of a solar cell.

Another aspect of the present invention provides a solar cell with an excellent photocurrent conversion rate.

According to at least one of embodiments, a solar spectral wavelength converting material includes an aluminum hydroxide precursor to which 1-pyrenecarboxylic acid is anchored.

According to another embodiment, a solar cell includes a solar spectral wavelength converting material according to the present invention.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings:

FIGS. 1A-1B illustrate photographs showing the light emitting capacity of a solar cell prepared according to Preparation Example 1 by using a UV lamp;

DETAILED DESCRIPTION

Figure 2A:
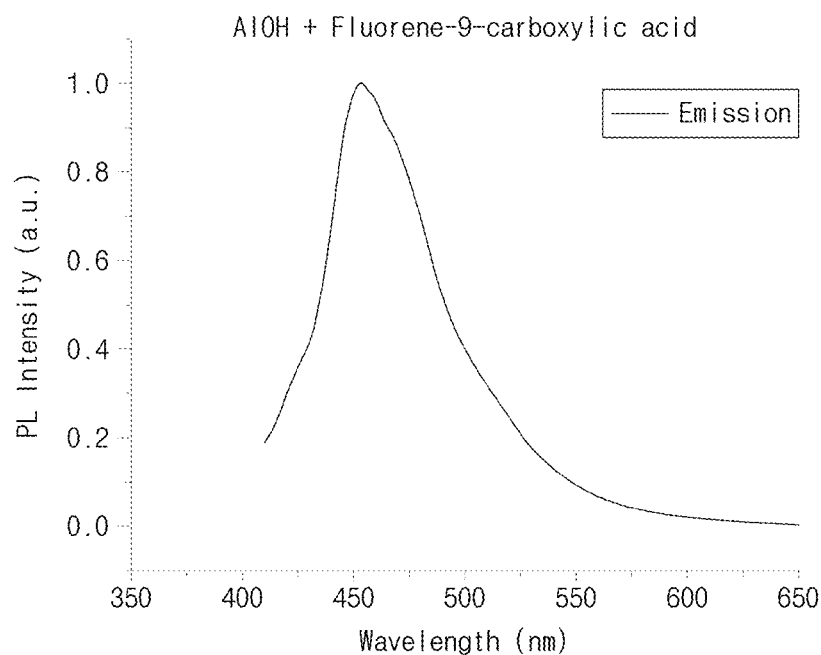
FIGS. 2A to 2E illustrate a graph showing the wavelength shift change of a solar cell prepared according to each of Comparative Preparation Examples 1 to 4 and Preparation Example 1.

Hereinafter, the present invention will be described in more detail. However, it is to describe the present invention in more detail, and is not intended to limit the scope of the present invention.

According to an embodiment of the present invention, provided is a solar spectral wavelength converting material including an aluminum hydroxide precursor to which 1-pyrenecarboxylic acid is anchored.

Here, the aluminum hydroxide precursor to which 1-pyrenecarboxylic acid is anchored is one in which 1-pyrenecarboxylic acid and an aluminum hydroxide precursor are not just physically bonded by simple stirring but anchored through thermal decomposition synthesis. When conducting FTIR analysis, if a —OH peak appears stronger than a C=O peak, it is defined that anchoring is achieved. The efficiency of a solar cell is much higher than when 1-pyrenecarboxylic acid is simply mixed with an aluminum hydroxide precursor.

Solar spectral wavelength conversion is mainly divided into down-conversion and up-conversion according to a light conversion method.

First, down-conversion is divided into down-shifting of absorbing one photon of a short wavelength (e.g., ultraviolet ray) having a higher energy than a silicon band gap, thereby converting the same into one photon of a long wavelength region having a low energy which silicon may absorb well and quantum-cutting of converting the same into two or more photons in a low energy region of a long wavelength of at least twice the absorbed wavelength.

In contrast, a technique of absorbing two photons in an infrared ray region which is not absorbed by silicon because the energy is smaller than the band gap of silicon, thereby converting the same into one photon in a high visible light region which is easily absorbed by silicon is referred to as up-conversion.

The present invention relates to a solar spectral wavelength converting material with improved efficiency by including low-cost luminescent aluminum hydroxide, and a solar cell including the solar spectral wavelength converting material, wherein the material is coated on a solar cell to make a device or positioned at an interface between the solar cell and a front encapsulating material on which sunlight is incident to induce down-conversion, non-reflective coating effect, and durability improvement, thereby improving photocurrent conversion efficiency due to an increase in short-circuit current.

Particularly, it is preferable to further include a compound which anchors one or more selected from the group consisting of an aromatic ring compound or a derivative thereof, lanthanum-based ions, and an up-converter material. The up-converter material may be, for example, GaAs or rare earth ions, and the like.

According to an embodiment of the present invention, the aluminum precursor is any one of aluminum monoacetate, aluminum triacetate, aluminum diacetate, aluminum triethyl aluminum, trimethyl aluminum, aluminum alkoxide, diethyl aluminum chloride, aluminum sulfate, aluminum cyanide, aluminum nitrite, aluminum carbonate, aluminum sulfite, aluminum hydroxide, aluminum oxide, aluminum chlorate, aluminum sulfide, aluminum chromate, aluminum trichloride, aluminum perchlorate, aluminum nitrate, aluminum permanganate, aluminum hydrogen carbonate, aluminum phosphate, aluminum oxalate, aluminum hydrogen phosphate, aluminum thiosulfate, aluminum chlorite, aluminum hydrogen sulfate, aluminum dichromate, aluminum bromide, aluminum hypochlorite, aluminum chloride hexahydrate, aluminum dihydrogen phosphate, aluminum phosphite, aluminum potassium sulfate dodeca hydrate, aluminum bromate, aluminum nitride, or a derivative thereof.

The solar spectral wavelength converting material may include the structure of $Al(OH)_3$, $AlOOH$, $5Al_2O_3 \cdot 2H_2O$, $Al_2O_3$, and the like, and in the present invention, the above structure is hereinafter referred to as aluminum hydroxide, AlOH, or aluminum hydroxide.

According to an embodiment of the present invention, when appropriately added, the aromatic ring compound and its derivative may be anchored to aluminum hydroxide to change the trap state of the aluminum hydroxide, and the position of the light emission wavelength may also be adjusted accordingly.

In addition, when light absorbed by the aromatic ring compound and its derivative is located at a higher energy than trap emission, it is possible to transfer energy from the aromatic ring compound and its derivative to the trap state of aluminum hydroxide. In this case, the light emitting intensity of the luminescent aluminum hydroxide is amplified by the additional energy transfer. That is, the aromatic ring compound and its derivative serve as an antenna which captures light in an ultraviolet wavelength region and transfers the light to aluminum hydroxide.

Therefore, when a 1-pyrenecarboxylic acid combination is anchored to aluminum hydroxide instead of using aluminum hydroxide alone as a material, an effective UV absorption amount increase and stronger visible ray and near-infrared ray emission are implemented to induce a down-conversion and to further improve photocurrent efficiency. In addition, since the trap state position is lowered, the light emission wavelength moves to a longer wavelength, so that Stokes shift, which is the difference between the absorption wavelength and the light emission wavelength may be increased to reduce the reabsorption of light emitted from the material.

According to an embodiment of the present invention, as the aromatic ring compound, one or more among an aromatic hydrocarbon, an aromatic heterocyclic compound in which some of carbon atoms forming a ring is substituted with oxygen, nitrogen, or sulfur atoms, or a derivative in which a portion of hydrogen among the aromatic hydrocarbon and aromatic heterocyclic compound molecules is substituted with a functional group may be selected.

According to an embodiment of the present invention, the aromatic ring compound may be selected from one or more among furan, benzofuran, isobenzofuran, pyrrole, indole, isoindole, thiophene, benzothiophene, isobenzothiophene, imidazole, benzimidazole, purine, pyrazole, indazole, oxazole, benzoxazole, isoxazole, benzisoxazole, thiazole, benzothiazole, benzene, naphthalene, anthracene, pyridine, quinoxaline, acridine, pyrimidine, quinazoline, pyridazine, cinnoline, phthalazine, 1,2,3-triazine, 1,2,4-triazine, 1,3,5-triazine and a derivative thereof.

Lanthanum-based ions capable of emitting near-infrared ray may be further added to a material in which 1-pyrenecarboxylic acid is combined in the aromatic ring, so that ultraviolet absorption as well as simultaneous visible ray and near-infrared ray emission are possible to implement a higher photocurrent conversion rate when the material is applied to a high-efficiency solar cell having excellent power generation efficiency in visible ray and near-infrared ray wavelength regions.

In addition, up-converter materials such as $Er^{3+}$ doped $NaYF_4$, $Tm^{3+}$ doped $NaYF_4$, or $Ho^{3+}$ $NaYF_4$ and the like may be added to a material in which 1-pyrenecarboxylic acid is combined in luminescent aluminum hydroxide, so that a solar cell may absorb not only natural sunlight of a high energy short wavelength band but also natural sunlight of low energy long wavelength band to further increase photocurrent efficiency through downconversion+upconversion.

The solar spectral wavelength converting material may be prepared by using hydrothermal, sol-gel, thermal decomposition synthesis methods, or the like. In the present invention, the present invention is described in more detail through the thermal decomposition synthesis method, but the scope of the present invention is not limited thereto.

When luminescent aluminum hydroxide is synthesized by the thermal decomposition synthesis method described above, a material having a boiling point higher than the thermal decomposition temperature of the aluminum precursor may be used as a solvent. For example, a material having a high boiling point of 200° C. or higher, such as hexadecylamine, 1-eicosene, 1-octadecene, docosane, phenyl ether, benzyl ether, octyl ether, oleic acid, oleylamine, and polyisobutylene, is used as a solvent.

The solvent may act as a solvent, or may act to control light-emitting properties or further improve light-emitting performance by providing impurities such as carbon, carbonyl radicals, oxalic phosphoric radicals, and sulfuric acid.

When 1-pyrenecarboxylic acid is added in a thermal decomposition synthesis step, absorption of luminescent aluminum hydroxide, increase in light emission, a large Stoke's shift and the like may be induced.

One or more of the aluminum precursors and one of an aromatic ring compound and its derivatives are dispersed in the solvent, and reacted at a thermal decomposition temperature of an aluminum precursor. When the reaction is completed, a product is separated and purified to obtain final luminescent aluminum hydroxide (solar spectral wavelength converting material). 1-pyrenecarboxylic acid may be added together with the aluminum precursor in the beginning stage, followed by performing synthesis, or may be additionally added after the synthesis of aluminum hydroxide, followed by performing synthesis to obtain a material.

Aluminum hydroxide prepared by thermal decomposition synthesis exhibits light-emitting properties due to the trap state emission caused by defects in a metal oxide. Trap state mission forms a trap state which is another energy level between a ground state and an excited state when there is a defect in the material, and electrons transferred from the ground state to the excited state by external energy are stabilized and moved to an even lower energy level generated due to the defect, and emit light while being transferring to the final ground state.

According to an embodiment of the present invention, the particle size of the solar spectral wavelength converting material is preferably 500 µm or less.

Since the solar spectral wavelength converting material is located on the front surface portion of a solar cell, a particle smaller in size than the wavelength of sunlight incident on the solar cell is advantageous. If the particle has a particle size similar to or larger than the wavelength of sunlight, the incident sunlight may be scattered or reflected to rather reduce the efficiency of the entire solar cell. Therefore, the particle size of the solar spectral wavelength converting material is preferably 0.1 nm to 500 µm, preferably 100 µm or less, and more preferably 10 µm.

In order to apply the solar spectral wavelength converting material to a silicon solar cell, there should be absorption in an ultraviolet wavelength region and light emitting properties in a visible ray wavelength region. Specifically, it is preferable that an absorption wavelength region is formed between 300 and 480 nm. In addition, it is preferable that a light emission wavelength region is formed between 450 and 1200 nm.

According to an embodiment, it is preferable that an encapsulating material into which the solar spectral wavelength converting material is introduced is in the form of a film having a thickness of 100 µm or less and dispersed in a light-transmitting resin.

Particularly, it is preferable that the absorption wavelength region and the light emission wavelength region of a solar spectral wavelength converting material do not overlap, and a material with a large Stokes shift is advantageous. This is because when an absorption wavelength and a light emission wavelength overlap, reabsorption, which is absorbing light emitted from the material again, acts as a loss.

The prepared luminescent aluminum hydroxide may be synthesized to have porosity according to variables such as a precursor, a solvent, impurities, thermal decomposition reaction temperature and time, or the like. When synthesized to have porosity, the surface area of the prepared luminescent aluminum hydroxide increases, so that durability such as moisture resistance and heat resistance of a solar module may be improved.

Properties required for a solar spectral wavelength converting material, especially for a down-conversion material, include high light emission efficiency, a high absorption coefficient, high light safety, ultraviolet ray absorption, light emission below a visible ray wavelength, and a large Stoke's shift (wavelength difference between the maximum absorption wavelength and the maximum light emission wavelength ($\Delta\lambda = \lambda_{em} - \lambda_{ab}$)) and the like.

In order to apply a down-conversion material to a solar cell, the down-conversion material should meet the required properties described above appropriately. Otherwise, the efficiency of the solar cell may be rather reduced. For example, when a material having low light emission efficiency is introduced to the front surface portion of a solar cell, the material absorbs sunlight, but cannot convert the sunlight into visible rays, and thus, may rather interfere with the sunlight absorption of the solar cell.

In addition, a material having a low absorption coefficient is low in absorption efficiency while having high light emission efficiency, and thus, is not likely to have a down-conversion effect. In the case of a material with absorption in a visible ray wavelength region which is lower than an ultraviolet wavelength region, since a commercially available silicon solar cell already has a high photocurrent conversion efficiency of 90% in the visible ray wavelength range, an additional down-conversion effect cannot be expected. Furthermore, a material having a small Stokes's shift is not likely to have an effective down-conversion effect since the degree of overlap between an absorption wavelength and a light emission wavelength is large, so that there may be loss due to the reabsorption of emitted light.

Meanwhile, when quantum-cutting is induced, a photon of a short wavelength which a solar cell cannot absorb is emitted as two or more photons of a long wavelength with high conversion efficiency of the solar cell, so that the efficiency of the solar cell may be dramatically improved.

Hereinafter, in order to prove that the solar spectral wavelength converting material prepared according to the present invention is an excellent solar spectral wavelength converting material capable of improving the efficiency of a solar cell, the present invention will be described with reference to the drawings.

FIG. 2 shows the absorption and light emission spectra of a luminescent aluminum hydroxide complex thus prepared. FIG. 2A is a light emission spectrum of a material synthesized using fluorene-9-carboxylic acid as a dopant instead of 1-pyrenecarboxylic acid in an aluminum hydroxide precursor. Like 1-pyrenecarboxylic acid, the material has an antenna called carboxylic acid, but it is a compound synthesized by varying the coefficient of an aromatic ring. It can be seen that a light emission peak is narrowly formed at 460 nm. FIG. 2B is a light emission spectrum of a compound in which pyrene is added to aluminum hydroxide, wherein pyrene has four aromatic rings like 1-pyrenecarboxylic acid, but is in the form of not having a carboxylic acid antenna, while exhibiting a light emission characteristic peat at 400 nm and 470 nm. FIG. 2C is a light emitting spectrum of aluminum hydroxide alone (AlOH) and shows a light emission characteristic peak at 390 nm and 450 nm. From the results of FIG. 2D, it can be seen that when an aromatic ring compound is introduced in a thermal decomposition synthesis step, absorption in an ultraviolet ray region is improved, and the difference between the maximum absorption wavelength and the light emission wavelength is further increased, so that it is possible to minimize the loss due to reabsorption. FIG. 2E is a spectrum of a light emitting material in which 1-pyrenecarboxylic acid is anchored to an aluminum hydroxide precursor claimed in the present invention.

The change in the light emission properties of a luminescent aluminum hydroxide due to the addition of an aromatic ring compound and its derivatives and the improvement of the efficiency of a solar cell by the aromatic ring compound and its derivatives may be more clearly understood through External Quantum Yield (EQE) measurement.

Figure 3A:
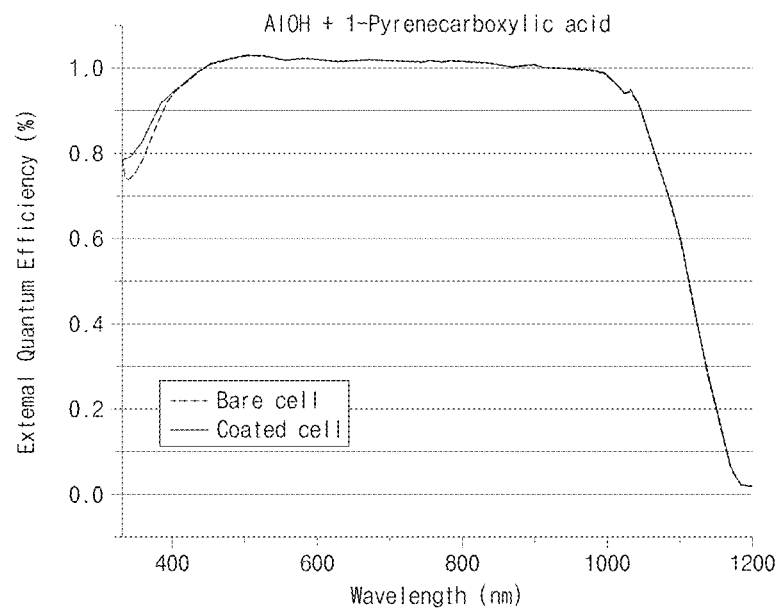
FIGS. 3A and 3B illustrate an EQE graph of a device according to the introduction of a solar cell of Example 1 and an enlarged graph showing an increase in efficiency on the UV side.
Figure 3B:
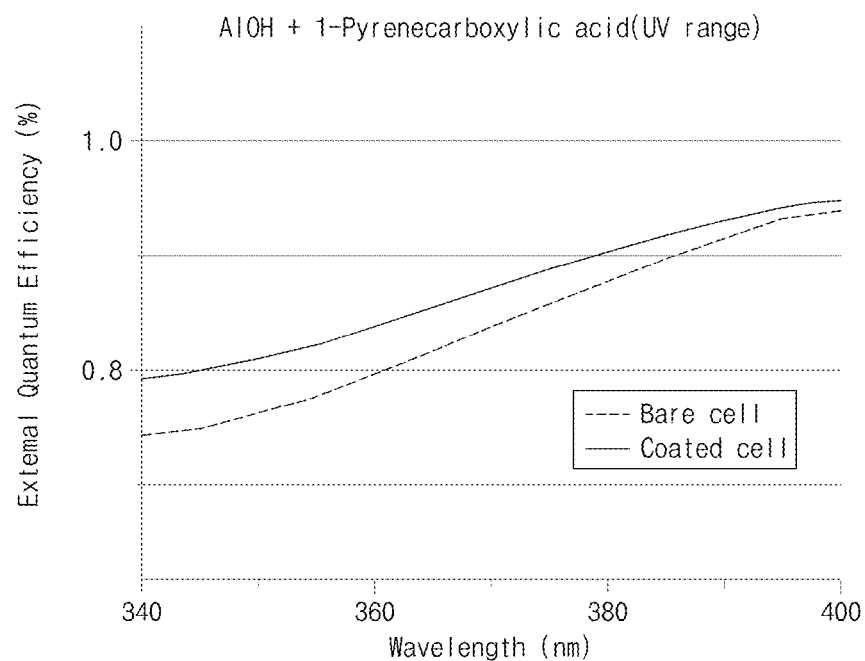

FIGS. 3A and 3B are the EQE of a compound in which 1-pyrenecarboxylic acid is added to aluminum hydroxide. It can be seen that the efficiency of a cell coated with the material was increased in an ultraviolet ray wavelength band compared to a typical bare cell not coated.

According to an embodiment of the present invention, the type and size of a material constituting a solar cell is not limited thereto. For example, the present invention may be applied to semiconductor-based solar cells such as organic photovoltaic cells (OPV), copper indium gallium selenide (CIGS), CdTe (cadmium telluride), and Perovskite, silicon-based solar cells, and semiconductor-silicon tandem structure-based solar cells, regardless of the type of materials thereof, and relates to a solar cell characterized by improving the photocurrent conversion efficiency of the solar cell. However, for the purpose of description, a 6-inch single crystal silicon solar cell was used.

According to an embodiment of the present invention, this material is coated on a solar cell to make a device or the solar spectral wavelength converting material according to the present invention may be used in a solar cell in which a solar spectral wavelength converting material is located at an interface between the solar cell and a front encapsulating material on which sunlight is incident.

A method for introducing the solar spectral wavelength converting material synthesized above into a solar cell may be, depending on the position at which the converter is introduced, a method for manufacturing a material in a sheet shape by dispersing the material in an encapsulating material serving to protect a solar cell, a method for directly applying the material on the front surface of the silicon solar cell, or a method for applying the material on the surface of an encapsulating material bonded to the front surface of a solar cell.

First, as the encapsulating material of the solar cell, materials such as ethylene vinyl acetate (EVA), polyolefin elastomer (POE), cross-linked polyolefin, thermal polyurethane (TPU), polyvinyl butyral (PVB), silicone, silicone/polyurethane hybrid, and ionomer are used, and EVA or POE is the most used.

In general, a method in which a solar spectral wavelength converting material is introduced into the inside of an encapsulating material and positioned on the front surface of a solar cell and then a solar cell module is manufactured through thermal lamination has been widely reported, and there are cases in which the method is applied to commercial production.

However, in this case, due to the large difference between the refractive index (n to 1.4) of a polymer such as EVA or POE constituting the encapsulating material and the refractive index of $SiN_x$ on the surface of a silicon solar cell surface (n to 2.5), light emitted from a light converting material inside the encapsulating material cannot proceed to the solar cell, and an optical waveguide phenomenon caused by internal total reflection inside the encapsulating material becomes dominant, so that the light proceeds to the side of an encapsulating material sheet.

On the contrary, when a solar spectral wavelength converting material is applied on the surface of a solar cell or the surface of an encapsulating material, the material becomes to be located at an interface between the encapsulating material and the solar cell, so that light does not proceed to the side of the solar cell due to a silicon texturing structure of several μm or tens of μm, but proceeds to the inside of the solar cell. In addition, if the solar spectral wavelength converting material may be adjusted to have a value between the refractive index (n to 1.4) of the encapsulating material and the refractive index (n to 2.5), of the surface of the solar cell surface, according to Snell's law, the entry of light in the direction of the encapsulating material, the light converting material, and the solar cell becomes very advantageous, making it possible to further use light on the side of the solar cell, so that photocurrent conversion efficiency may be improved. That is, the down-conversion effect and the non-reflective coating effect of the solar spectral wavelength converting material may be both expected.

The solar spectral wavelength converting material may dispersed in a solvent to be applied on the surface of a solar cell, and a method for applying the same on the surface of the solar cell may be spin coating, bar coating, and spray coating, dip coating, screen printing, and the like. In addition, even when applied on an encapsulating material, the above methods may all be applied except for the spin coating method.

In the present invention, in consideration of the commercial production application of the solar spectral wavelength converting material, a spray coating method capable of quick and uniform coating was used, but the present invention is not limited thereto.

Hereinafter, preferred embodiments of the present invention will be described in detail, but the following embodiments are provided only to facilitate understanding of the present invention, and the scope of the present invention is not limited to the following embodiments.

Preparation Example 1: Preparation of Luminescent Aluminum Hydroxide and Solar Spectral Wavelength Converting Material In a 3-neck bottled glass, 1.0 to 3.0 g of aluminum acetate (aluminum precursor), 0.01 to 0.1 g of 1-Pyrenecarboxylic acid, and 50 to 300 mL of 1-Octadecene are added, stirred in a vacuum state, and heated to 100° C. to perform pretreatment. After maintaining the above state for about 1 hour, removed of air and moisture, and purged with nitrogen or argon is performed in a vacuum state.

Thereafter, to the reactant heat is applied to about 270 to 320° C. and it is maintained for 2 to 4 hours to perform thermal decomposition. Thereafter, cooling is performed at room temperature, and then work-up is performed to prepare a solar spectral wavelength converting material.

[Work-Up]

Using acetone and toluene, the solar spectral wavelength converting material is washed, followed by storing.

※ Information on raw materials used—Aluminum Acetate (MW: 162.08 g/mol); Sigma-Aldrich—1-Pyrenecarbboxylic acid (MW: 246.26 g/mol); Sigma-Aldrich—1-Octadecene (MW: 252.48 g/mol); Sigma-Aldrich—Acetone (MW: 58.08 g/mol); Daejung—Toluene (MW: 92.14 g/mol); J. T. Baker Comparative Preparation Example 1

A solar spectral wavelength converting material was prepared in the same manner as in Preparation Example 1 except that a dopant (Fluorene-9-carboxylic acid) having carboxylic acid but not having 4 aromatic rings was used instead of using 1-Pyrenecarboxylic acid as a dopant.

Comparative Preparation Example 2

A solar spectral wavelength converting material was prepared in the same manner as in Preparation Example 1 except that a dopant (Pyrene) having 964 aromatic rings but not having an antenna which is a carboxylic acid group was used.

Comparative Preparation Example 3

A solar spectral wavelength converting material was prepared in the same manner as in Preparation Example 1 except that a dopant was not used.

Comparative Preparation Example 4

To the prepared Comparative Preparation Example 3, 1-Pyrenecarboxylic acid was added, and then stirring was performed for 5 minutes. Thereafter, using acetone and toluene, centrifugation was performed to prepare a solar spectral wavelength converting material.

Example 1: Manufacturing Solar Cell Coated with Solar Spectral Wavelength Converting Material A 6-inch single crystal silicon solar cell was used.

A solution of the solar spectral wavelength converting material prepared according to Preparation Example 1 was applied on the surface of the 6-inch single crystal silicon cell using a spray coating method. When thus manufactured, the solar spectral wavelength converting material is located on the surface of the solar cell, and when EQE (external quantum efficiency) is measured, it can be seen how the efficiency of the solar cell changes by the applied solar spectral wavelength converting material.

Comparative Example 1

A solar cell was manufactured in the same manner as in Example 1 except that the type of Preparation Example 1 was changed to that of Comparative Preparation Example 3.

Example 2: Manufacturing Solar Cell Including Solar Spectral Wavelength Converting Material 4 solar cells coated with the solar spectral wavelength converting material prepared in Example 1 were soldered to 2×2 to manufacture a solar cell module.

A silicon solar cell module was manufactured through lamination after laminating glass/encapsulating material/solar cell converting material/solar cell/encapsulating material/back sheet in such order from the front surface on which light is incident. In thus manufactured solar cell module, luminescent aluminum hydroxide is located between an encapsulating material and a solar cell interface. As the solar spectral wavelength converting material constituting the solar cell, luminescent aluminum hydroxide prepared by the above method was used.

Comparative Example 2

A solar cell was manufactured in the same manner as in Example 2 except that a bare cell was used without applying a light converting material on the solar cell.

Example 3: Preparing Solar Cell Encapsulating Material for Evaluating Durability 0.2 parts by weight of aluminum hydroxide to which 1-Pyrenecarboxylic acid of Preparation Example 1 was anchored was compounded based on 100 parts by weight of ethylene-vinyl acetate copolymer to prepare a mixture. Thereafter, a crosslinking agent and a crosslinking aid were blended to prepare an encapsulating material composition. The encapsulating material composition was applied to a T-die extrusion process of 100° C. to prepare an encapsulating material having a thickness of 300 micrometers.

Comparative Example 3

An encapsulating material was prepared in the same manner as in Example 1 except that the type of Preparation Example 1 was changed to that of Comparative Preparation Example 4.

Experimental Example 1: Identification of Light Emitting Capability

The solar cell manufactured according to Example 1 was illuminated by a UV lamp to determine the light emitting capability thereof. When illuminated by the UV lamp, a compound which was yellow in natural light (FIG. 1A) emitted blue (FIG. 1B). The results are shown in FIGS. 1A-1B.

As shown in FIGS. 1A-1B, the solar cell of Example 1 manufactured according to the present invention absorbs the UV side, and thus, has excellent light emitting capability.

Experimental Example 2: Performance Evaluation of Solar Cell Including Light Converting Device In order to compare the performance of a solar cell according to each of Example 1 and Comparative Examples 1 to 4, the light emission wavelength band each thereof was measured using a photoluminescence spectrometer, and the shift change according to each light emission wavelength band was identified. The shift change is shown in each of FIG. 2A to FIG. 2E.

Figure 2B:
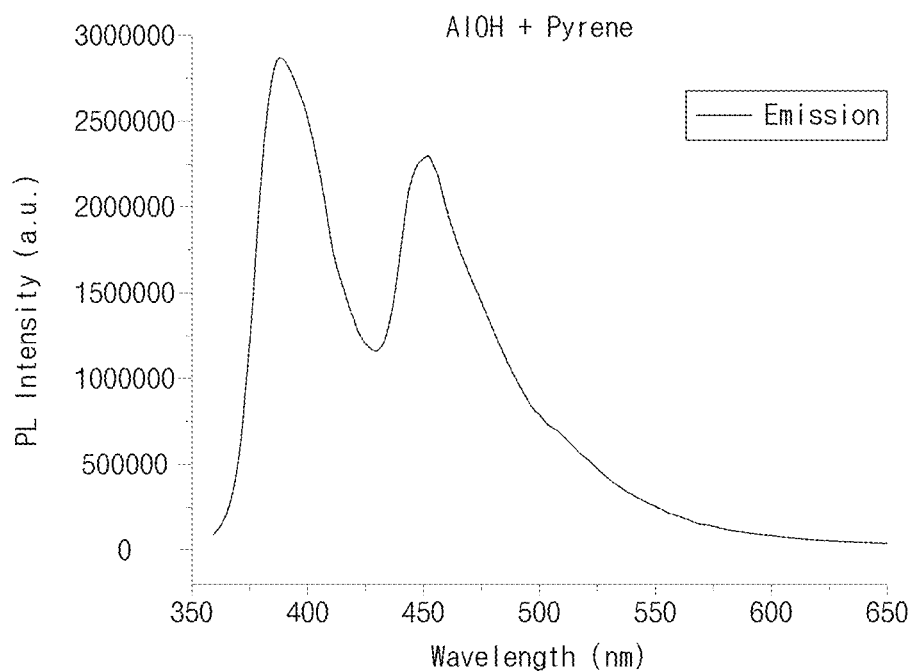
Figure 2C:
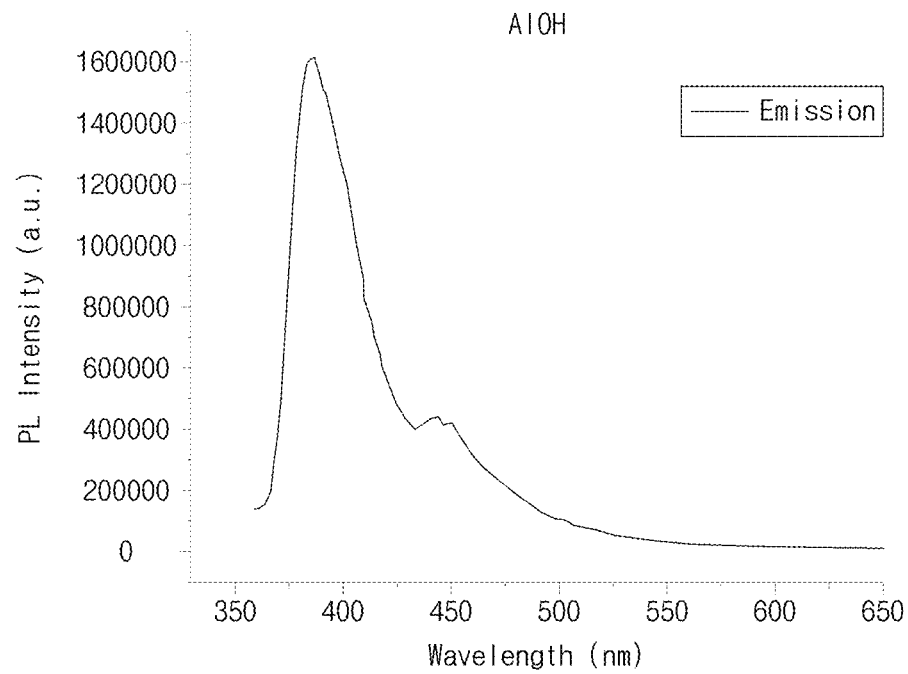
Figure 2D:
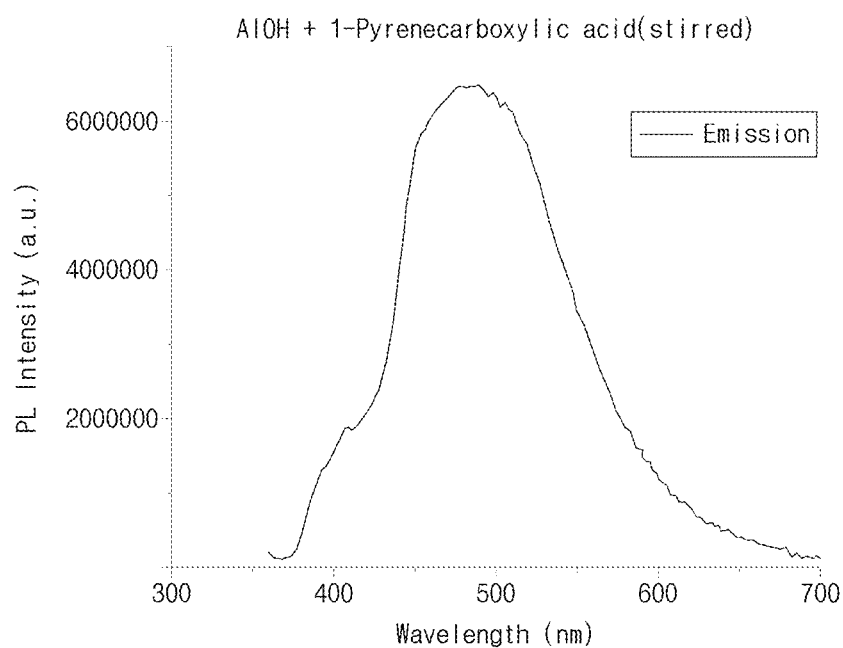
Figure 2E:
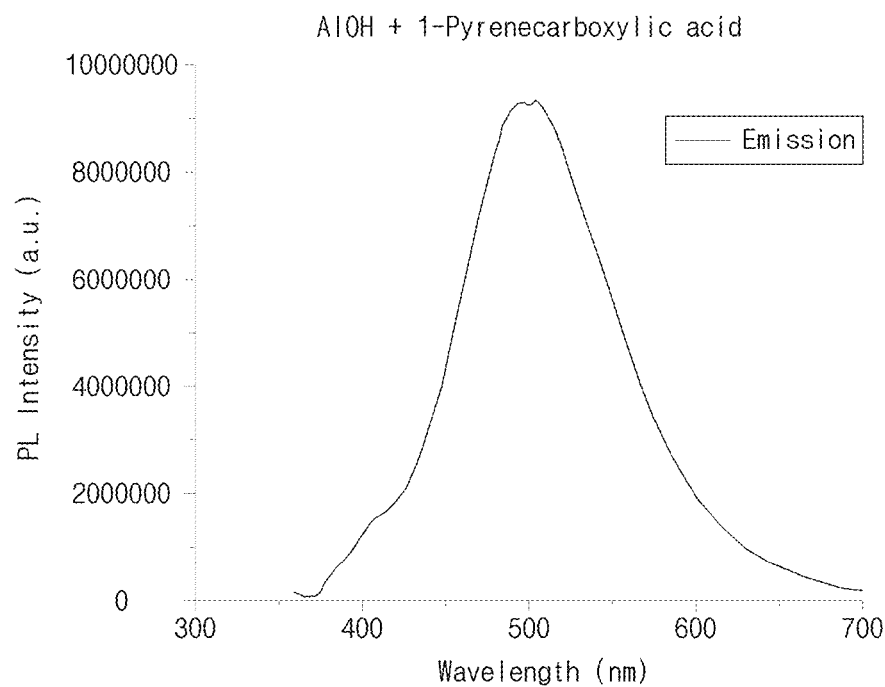

FIG. 2A is a light emission spectrum of a material synthesized using fluorene-9-carboxylic acid as a dopant instead of 1-pyrenecarboxylic acid in an aluminum hydroxide precursor. Like 1-pyrenecarboxylic acid, fluorene-9-carboxylic acid has an antenna called carboxylic acid, but it is a compound synthesized by varying the number of an aromatic ring, and emits light in a further front wavelength band than 1-pyrene carboxylic acid, so that absorption and overlapping area increase, and thus, efficiency is expected to be reduced. FIG. 2B is a light emission spectrum of a compound in which pyrene is added to aluminum hydroxide, wherein pyrene has four aromatic rings like 1-pyrenecarboxylic acid, but does not have a carboxylic acid antenna. Referring to the light emitting spectrum of the compound of this type, the compound emits light in a further front wavelength band than fluorene-9-carboxylic acid, and thus, the light emission spectrum overlaps an absorption spectrum a lot, thereby increasing a reabsorption rate, and as a result, the efficiency of a solar cell is reduced. FIG. 2C is a light emitting spectrum of aluminum hydroxide alone (AlOH) and shows a light emission characteristic peak at 390 nm and 450 nm. This spectrum is also expected to overlap an absorption spectrum a lot. FIG. 2D is a light emission spectrum of a compound in which 1-pyrenecarboxylic acid is not anchored to aluminum hydroxide but stirred together by performing simple physical synthesis. Referring to the light emitting spectrum of the compound of this type, a peak is seen at 480 nm, which is on the red wavelength band side, due to the influence of 1-pyrenecarboxylic acid, and a peak is also formed at 400 nm as shown in FIG. 2C, which is the light emission spectrum of a typical aluminum hydroxide. This is a spectrum that appears because 1-pyrenecarboxylic acid is not definitely anchored to aluminum hydroxide but the two are present in the compound, and the light emission wavelength could not be red-shifted compared to an anchored compound. FIG. 2E is a light emission wavelength band of aluminum hydroxide and 1-pyrenecarboxylic acid, which is a compound claimed in the present patent. Compared to FIGS. 2A to 2D, the light emission wavelength band was shifted to 500 nm, which is a long wavelength band, and thus, the degree of overlapping is small, and when applied to a solar cell, efficiency increases.

Experimental Example 3: Confirming Efficiency Increase on UV Side by EQE Measurement In order to verify the efficiency of the introduction of a solar spectral wavelength converting material, the External Quantum Efficiency (EQE) of each of the solar cells of Example 1 and Comparative Example 1 was measured and evaluated.

FIGS. 3A and 3B are the EQE after spray coating a compound in which 1-pyrenecarboxylic acid is introduced into aluminum hydroxide on a 6-inch c-Si cell. Referring to FIG. 3A, the external quantum efficiency is increased compared to a bare cell in the same drawing. Of this, a portion was enlarged as shown in FIG. 3B to see the effect of improving the quantum efficiency by solar irradiance spectrum received from an ultraviolet portion. Referring to FIG. 3B, a spray-coated solar cell portion was increased compared to the bare cell, from which it can be seen that there was a down-conversion effect due to the introduction of aluminum hydroxide and 1-pyrenecarboxylic acid.

In order to identify the difference in EQE efficiency increase between when 1-pyrenecarboxylic acid was synthesized with aluminum hydroxide and without, aluminum hydroxide to which 1-pyrenecarboxylic acid was not introduced (Comparative Preparation Example 3) was spray coated onto a solar cell to measure EQE (Comparative Example 1). The result is shown in FIGS. 3C and 3D.

Figure 3C:
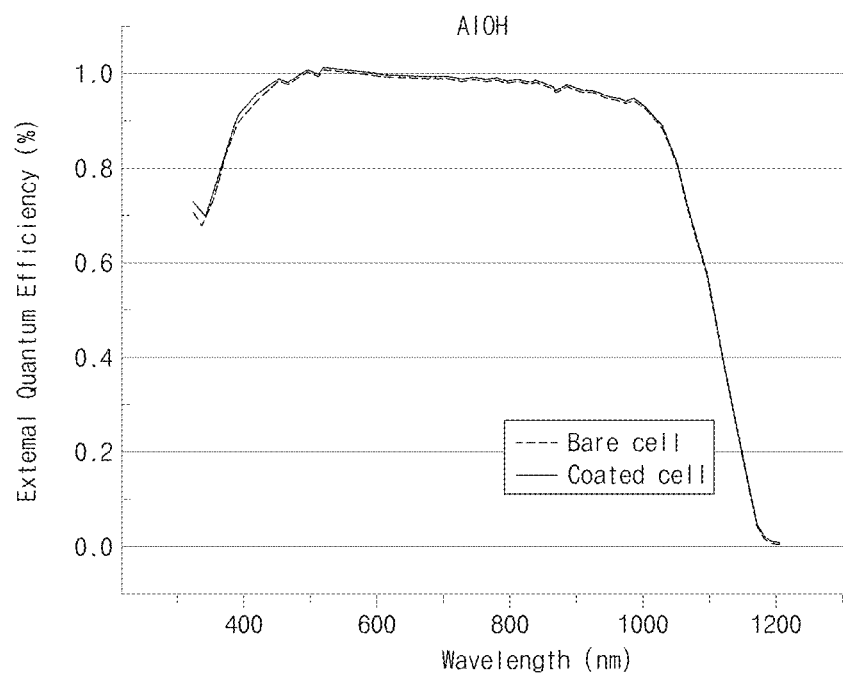
FIGS. 3C and 3D illustrate an EQE graph of a device according to the introduction of a solar cell of Comparative Example 1 and an enlarged graph showing an increase in efficiency on the UV side.
Figure 3D:
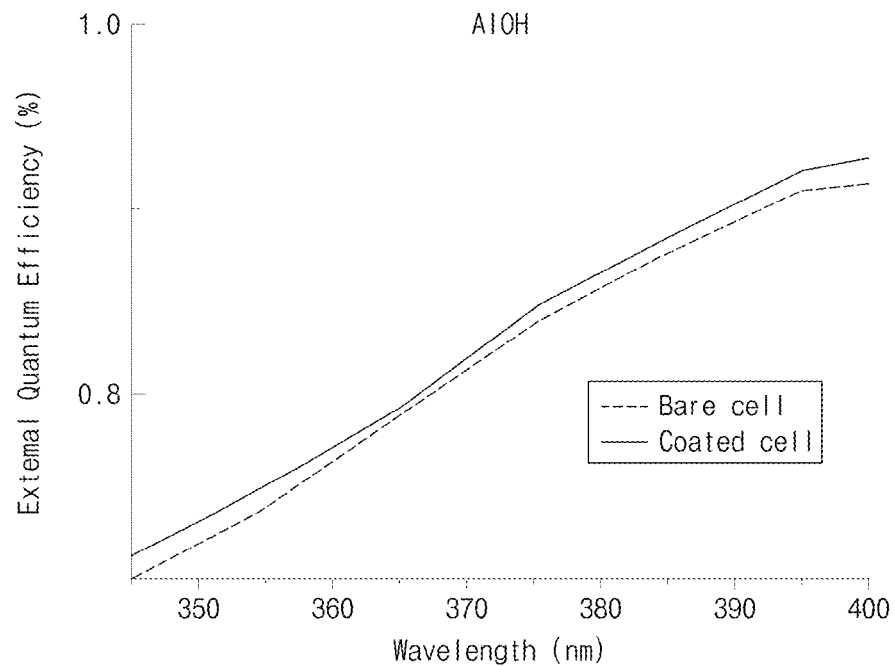

Referring to FIG. 3C, it can be seen that the efficiency of the solar cell spray coated with aluminum hydroxide was increased compared to the bare cell. However, referring to the enlarged spectrum of an ultraviolet portion shown in FIG. 3D, the efficiency increase in the ultraviolet portion was significantly less than that shown in FIG. 3B. This indicates that the efficiency of down-conversion is not significantly increased when 1-pyrenecarboxylic acid is not synthesized with aluminum hydroxide.

The present invention provides a technology in which the long-term durability of a solar cell and a solar module are increased and the output degradation over time is minimized to guarantee the amount of power generation by improving the durability of an encapsulating material, thereby maintaining the permeability of an encapsulating material layer when the solar cell and the solar module are constructed by dispersing luminescent aluminum hydroxide in the encapsulating material for sunlight.

Experimental Example 4: Identifying Difference Between Anchored Material and Non-Anchored Material Through FTIR Analysis FTIR analysis was conducted to confirm anchoring for a light converting material. Preparation Example 1 and Comparative Preparation Example 4 were prepared by introducing the same material, but by varying a synthesis method. In Preparation Example 1, anchoring was performed through thermal decomposition synthesis, while in Comparative Preparation Example 4, two materials were physically bonded using simple stirring.

Figure 4:
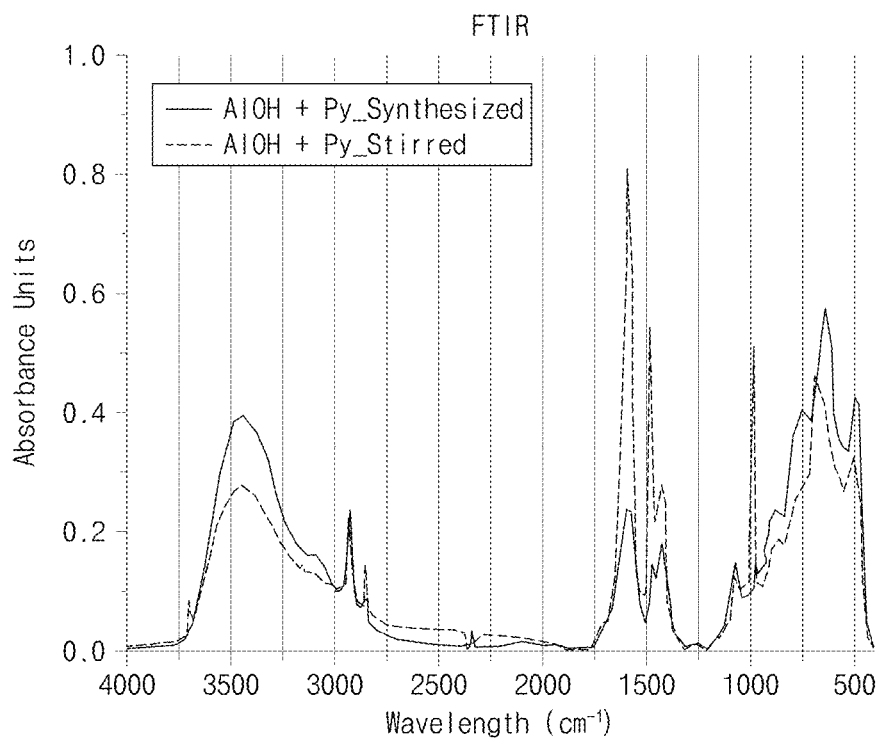
FIG. 4 illustrates a graph of the FTIR analysis for Preparation Example 1 and Comparative Preparation Example 4.

A C—O bond peak of these peaks of graph in FIG. 4 may be seen as evidence of the presence of acetate. Often, it is known that a C=O bond appears around 1700 cm$^{-1}$, but a C—O bond generated in an acetate group shows symmetric and asymmetric stretching modes at ~1415 cm$^{-1}$ and ~1570 cm$^{-1}$, respectively. Among these, unidentate acetate which is bonded to a single metal forms a C=O bond, and an asymmetric bend is formed in a slightly rear side of 1590 to 1650 cm$^{-1}$. Therefore, as shown in the result shown in FIG. 4, both Preparation Example 1 synthesized by applying heat and Comparative Preparation Example 4 in which two materials were introduced without applying heat show C=O at ~1590 cm$^{-1}$. In addition, the two materials show a broad —OH peak at 3400 cm$^{-1}$, which is a peak represented by the acid of 1-pyrenecarboxylic acid, and it can be said that both materials contain 1-pyrenecarboxylic acid. In FIG. 4, the difference in intensity between the two peaks (C=O peak and —OH peak) is important.

In the graph of Preparation Example 1 (blue solid line), the intensity of the —OH peak was stronger than that of the C=O peak, whereas in the graph of Comparative Preparation Example 4 (red solid line), the intensity each thereof was formed as opposed to Preparation Example 1. This may be due to the ratio of —OH and C=O in a sample. When heat is applied, acetate is discharged from an acetate group in aluminum acetate, and an anchored 1-pyrenecarboxylic acid takes the place.

On the other hand, when the two materials were added and only stirred without applying heating thereto, 1-pyrenecarboxylic acid was not anchored to aluminum acetate, so that there was a lot of residual acetate in aluminum, allowing a C=O peak of the acetate group to be clearly seen in a FTIR graph. Therefore, the C=O peak of Preparation Example 1 synthesized by applying heat appeared weaker than the —OH peak, indicating that the ratio of —OH and C=O was reduced, whereas in Comparative Preparation Example 4 physically mixed, there were many C=O bonds remaining inside the material, so that the C=O peak appeared relatively stronger than the —OH peak. These results show that 1-pyrenecarboxylic acid is anchored to aluminum when the synthesis method of the present patent is performed.

Experimental Example 5: Performance Evaluation Through Outdoor Evaluation of Solar Cell Coated with Solar Spectral Wavelength Converting Material An outdoor evaluation device was used to analyze the change in solar cell efficiency according to the introduction of aluminum hydroxide to which 1-Pyrenecarboxylic acid was anchored, and the efficiency change before and after the aluminum hydroxide coating was specified. Table 1 shows the results of measuring the efficiency after mounting a solar cell in which a 6-inch single crystal silicon solar cell coated with Preparation Example 1 was assembled to a 4-cell mini module (Example 2) and a solar cell in which a 6-inch single crystal silicon solar cell not coated with a light converting material was assembled to a 4-cell mini module (Comparative Example 2) outdoors, respectively.

TABLE 1

|  | Bare cell (Comparative Example 2) | Coated cell (Example 2) |
| --- | --- | --- |
| Jsc (mA/cm2) | 38.31 | 39.01 |
| Jsc (rel. %) | — | 1.83 |
| Voc (V) | 2.51 | 2.52 |
| Voc (rel. %) | — | 0.40 |
| Pmax (Watt) | 13.27 | 13.53 |
| Pmax (rel. %) | — | 1.96 |

In Table 1, it can be seen that when the luminescent aluminum hydroxide to which 1-Pyrenecarboxylic acid was anchored was coated, both short-circuit current and output were increased compared to a bare cell not coated. That is, the solar cell efficiency was increased due to the increase in short-circuit current density of the silicon solar cell caused by the down-conversion effect due to ultraviolet ray absorption and visible ray emission of the light converting material.

Experimental Example 6: Transmittance Evaluation According to Ultraviolet Exposure of Solar Spectral Wavelength Converting Material with or without Anchoring A material to which aluminum hydroxide and 1-Pyrenecarboxylic acid was anchored by applying heat (Preparation Example 1) and a material obtained by simply adding aluminum hydroxide and 1-Pyrenecarboxylic acid together followed by performing centrifugation (Comparative Preparation Example 4) were subjected to durability evaluation. The durability evaluation was conducted by transmittance analysis since it is possible to know how much light a material can receive in a specific wavelength band through the transmittance analysis. Since the present light converting material converts light in an ultraviolet wavelength band and increases light conversion efficiency, it is important to have good transmittance in the ultraviolet wavelength band. However, when a solar cell receives ultraviolet rays, a haze is generated causing a phenomenon in which light is obstructed. When the light obstruction phenomenon occurs, it is difficult to pass a large amount of light therethrough, so that the efficiency of the solar cell is relatively reduced. Therefore, the durability evaluation of a solar cell is an important factor in the evaluation of a solar cell, and which solar spectral wavelength converting material synthesized in which manner among the materials shows light conversion efficiency with less impact on durability when introduced to a solar cell was investigated.

Durability evaluation through ultraviolet exposure was analyzed using UV-con equipment of ATLAS, and press sheets were manufactured using Preparation Example 1 and Comparative preparation Example 4 as Example 3 and Comparative Example 3, respectively, and the press sheets were placed in glass/glass to conduct measurement with ultraviolet exposure specifications of 0.5 W, 40° C. and 15 hr.

Figure 5:
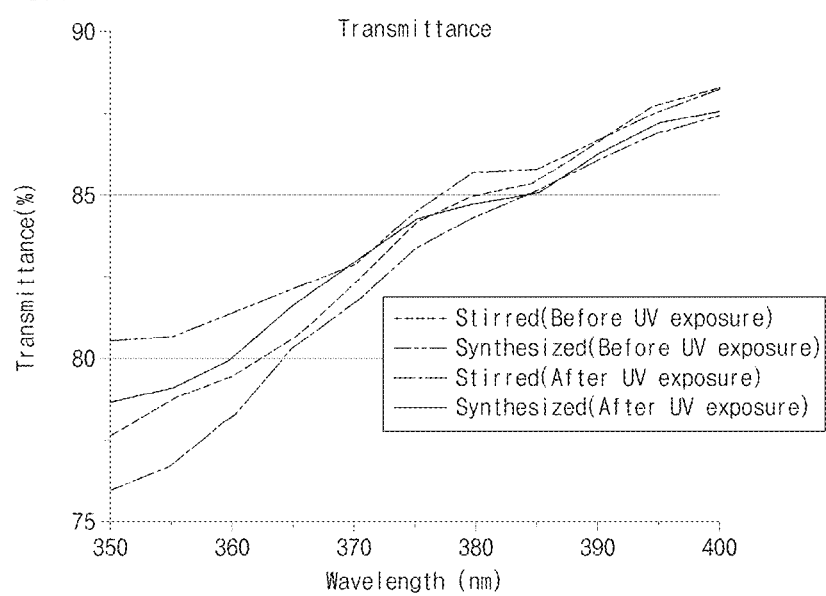
FIG. 5 illustrates a graph showing the change in transmittance according to ultraviolet exposure of Example 3 and Comparative Example 3.

FIG. 5 is a graph comparing the transmittance of Example 3 and Comparative Example 3. The blue solid line and the purple solid line represent transmittances before and after the ultraviolet durability evaluation of Example 3, and the red and green solid lines represent transmittances before and after the ultraviolet durability evaluation of Comparative Example 3. In general, it can be seen that transmittance decreases when the material receives a large amount of ultraviolet rays. However, Example 3 synthesized by a thermal decomposition method was determined to have excellent durability before and after compared to Comparative Example 3 prepared by simple synthesis, and Example 3 after the durability evaluation showed better transmittance than Comparative Example 3 before the durability evaluation. That is, when 1-Pyrenecarboxylic acid is anchored to aluminum hydroxide, a new compound is formed to act advantageously in terms of durability, which results in a slow decrease in light conversion efficiency even after strong ultraviolet exposure.

As described above, when a solar spectral wavelength converting material according to the present invention is applied to a solar cell, it is possible to increase an output amount due to the down-conversion effect and improve the durability of the solar cell due to ultraviolet ray blocking, so that it is possible to reduce the power generation cost of the solar cell and guarantee the long-term output.

When the material is located at an interface of a solar cell in the form of a coated device or an encapsulating material into which the material is introduced, an increase in light-generating current due to an non-reflective coating effect, an anti-potential induced degradation (PID) effect of a solar module due to the collection of Na+ ions generated in tempered glass of the module, and an anti-light and elevated temperature induced degradation (LeTID) effect due to ultraviolet ray blocking and heat dissipation properties may be expected.

In addition, unlike in a related art, it is possible to obtain the convenience of synthesis by using a one-pot synthesis method, and it is possible to produce a low-priced light harvesting material. In addition, high efficiency is exhibited even in a mono-crystalline Si cell with high solar spectral wavelength conversion efficiency.

The above-described embodiment is merely one embodiment for carrying out the battery module, and the present disclosure is not limited to the embodiment, and the technical spirits of the present disclosure include all ranges of technologies that may be variously modified by an ordinary person in the art, to which the present disclosure pertains, without departing from the essence of the present disclosure as claimed in the following claims.

What is claimed is:

1. A solar spectral wavelength converting material comprising an aluminum hydroxide to which 1-pyrenecarboxylic acid is anchored by a process comprising combining an aluminum hydroxide precursor and 1-pyrenecarboxylic acid in a solvent having a boiling point of at least 200° C. and heating the mixture, followed by removing air and moisture and purging with inert gas, then heating the resulting mixture at a temperature and for a time sufficient to perform thermal decomposition.

2. The solar spectral wavelength converting material of claim 1, wherein the aluminum hydroxide is obtained from a aluminum hydroxide precursor selected from the group consisting of aluminum monoacetate, aluminum triacetate, aluminum diacetate, aluminum triethyl aluminum, trimethyl aluminum, aluminum alkoxide, diethyl aluminum chloride, aluminum sulfate, aluminum cyanide, aluminum nitrite, aluminum carbonate, aluminum sulfite, aluminum hydroxide, aluminum oxide, aluminum chlorate, aluminum sulfide, aluminum chromate, aluminum trichloride, aluminum perchlorate, aluminum nitrate, aluminum permanganate, aluminum hydrogen carbonate, aluminum phosphate, aluminum oxalate, aluminum hydrogen phosphate, aluminum thiosulfate, aluminum chlorite, aluminum hydrogen sulfate, aluminum dichromate, aluminum bromide, aluminum hypochlorite, aluminum chloride hexahydrate, aluminum dihydrogen phosphate, aluminum phosphite, aluminum potassium sulfate dodeca hydrate, aluminum bromate, aluminum nitride, and derivatives thereof.

3. The solar spectral wavelength converting material of claim 1, wherein the solar spectral wavelength converting material comprises a structure of $Al(OH)_3$, AlOOH, AlOH, $5Al_2O_3 \cdot 2H_2O$, or $Al_2O_3$.

4. The solar spectral wavelength converting material of claim 1, further comprising a compound containing one or more selected from the group consisting of an aromatic ring compound or a derivative thereof, lanthanum-based ions, and an up-converter material.

5. The solar spectral wavelength converting material of claim 4, wherein the aromatic ring compound is any one or more members selected from the group consisting of furan, benzofuran, isobenzofuran, pyrrole, indole, isoindole, thiophene, benzothiophene, isobenzothiophene, imidazole, benzimidazole, purine, pyrazole, indazole, oxazole, benzoxazole, isoxazole, benzisoxazole, thiazole, benzothiazole, benzene, naphthalene, anthracene, pyridine, quinoxaline, acridine, pyrimidine, quinazoline, pyridazine, cinnoline, phthalazine, 1,2,3-triazine, 1,2,4-triazine, 1,3,5-triazine and derivatives thereof.

6. The solar spectral wavelength converting material of claim 1, wherein the solar spectral wavelength converting material has a particle size of from 0.1 nm to 500 μm.

7. The solar spectral wavelength converting material of claim 1, wherein the solar spectral wavelength converting material has a maximum absorption wavelength of from 300 to 480 nm, and a maximum emission wavelength of from 450 to 1200 nm.

8. The solar spectral wavelength converting material of claim 1, wherein the solar spectral wavelength converting material is in a form of a film having a thickness of 100 μm or less and dispersed in a light-transmitting resin.

9. A solar cell on which sunlight is incident and comprises a front encapsulating material and a solar spectral wavelength converting material located at an interface of the solar cell, wherein the solar spectral wavelength converting material is the solar spectral wavelength converting material of claim 1.

10. The solar cell of claim 9, wherein the solar spectral wavelength converting material is in a form of a coating either on a front surface of the solar cell or a rear surface of the front encapsulating material of the solar cell.

11. The solar cell of claim 10, wherein the coating is spray or screen coating.

12. The solar cell of claim 9, wherein the front encapsulating material is a member selected from the group consisting of ethylene vinyl acetate (EVA), polyolefin elastomer (POE), cross-linked polyolefin, thermal polyurethane (TPU), polyvinyl butyral (PVB), silicone, silicone/polyurethane hybrid, and ionomer.

* * * * *